(12) United States Patent
Harima

(10) Patent No.: US 7,745,978 B2
(45) Date of Patent: Jun. 29, 2010

(54) QUARTZ CRYSTAL DEVICE

(75) Inventor: Hidenori Harima, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 0 days.

(21) Appl. No.: 12/205,116

(22) Filed: Sep. 5, 2008

(65) Prior Publication Data

US 2009/0066190 A1   Mar. 12, 2009

(30) Foreign Application Priority Data

Sep. 6, 2007   (JP) .............................. 2007-231367

(51) Int. Cl.
H01L 41/09 (2006.01)

(52) U.S. Cl. .................... 310/344; 310/348; 310/349; 310/361

(58) Field of Classification Search ................. 310/340, 310/344, 348, 349, 361
See application file for complete search history.

(56) References Cited

U.S. PATENT DOCUMENTS

| | | | | |
|---|---|---|---|---|
| 4,293,986 A | * | 10/1981 | Kobayashi et al. | 29/25.35 |
| 4,362,961 A | * | 12/1982 | Gerber | 310/370 |
| 4,451,754 A | * | 5/1984 | Stolz et al. | 310/348 |
| 5,449,965 A | * | 9/1995 | Tsuru | 310/351 |
| 5,596,243 A | * | 1/1997 | Tsuru et al. | 310/348 |
| 6,606,772 B1 | * | 8/2003 | Nohara et al. | 29/25.35 |

FOREIGN PATENT DOCUMENTS

JP   9-326663   12/1997

* cited by examiner

*Primary Examiner*—Thomas M Dougherty
(74) *Attorney, Agent, or Firm*—Cantor Colburn LLP

(57) ABSTRACT

A quartz crystal device includes: a quartz crystal blank having an outer perimeter part and a vibration region partially separated mechanically from the outer perimeter part by a cut-out groove; a first container joined to a first principal surface of the crystal blank by being joined to an entire perimeter of the perimeter part of the crystal blank via a brazing material layer in the first principal surface; and a second container joined to a second principal surface of the crystal blank by being joined to an entire perimeter of the outer perimeter part of the crystal blank via a brazing material layer in the second principal surface. The vibration region of the crystal blank is hermetically encapsulated in a space formed by the first container, the second container and the outer perimeter part of the crystal blank.

6 Claims, 4 Drawing Sheets

QUARTZ CRYSTAL DEVICE

BACKGROUND OF THE INVENTION

1. Field of the Invention

The present invention relates to a quartz crystal device, such as a crystal unit and a crystal oscillator, having the configuration in which at least a vibration region of a quartz crystal blank is hermetically encapsulated in a container.

2. Description of the Related Art

A quartz crystal unit in which a quartz crystal blank is hermetically encapsulated in a container, a crystal oscillator in which such a crystal unit and an IC (integrated circuit) chip with a circuit using the crystal unit are integrated, and the like are generically called quartz crystal devices, and are used in various kinds of electronic equipment. Above all, surface-mount quartz crystal devices each having the configuration in which a crystal blank is hermetically encapsulated in a surface-mount container are widely incorporated especially in portable electronic equipment, for example, portable telephones as reference sources for frequency and time because of their compactness and light weight.

FIGS. 1A and 1B are respectively a sectional view and a bottom view showing a configuration of a conventional surface-mount crystal oscillator as one example of a quartz crystal device.

The illustrated crystal unit is such that quartz crystal blank 2 is housed in surface-mount container body 1, and crystal blank 2 is hermetically encapsulated in the container by being covered with metal cover 3. Container body 1 is constituted of, for example, laminated ceramics, and has a substantially rectangular planar outer shape, that is, a flat outer shape of a substantially rectangular parallelepiped which looks like a rectangle seen from above when the crystal unit is mounted on a wiring board. A recess for housing crystal blank 2 is formed on a top surface of container body 1. On an inner bottom surface of the recess, a pair of crystal holding terminals 4 are provided to be close to the positions of both ends of one side of the inner bottom surface. Crystal holding terminals 4 are used for electrically and mechanically holding crystal blank 2 in the recess as will be described later.

Mounting electrodes which are used when container body 1 is surface-mounted on a wiring substrate are provided at four corner portions on an outer bottom surface of container body 1, that is, a surface which faces the wiring board when being mounted on the wiring board. Each of the mounting electrodes is formed as a substantially rectangular conductive layer. Out of these four mounting electrodes, a pair of mounting electrodes 5a which are located at both ends of one diagonal line in the outer bottom surface of container body 1 are electrically connected to a pair of crystal holding terminals 4 through conductive paths formed in container body 1. Further, remaining two mounting electrodes 5b are used as ground terminals.

Crystal blank 2 which are used in such a crystal unit is constituted of, for example, a substantially rectangular AT-cut quartz crystal blank, and excitation electrodes 6a are formed respectively on both principal surfaces. Lead electrodes 6b are extended from a pair of excitation electrodes 6a to both sides of one end portion of crystal blank 2. Lead electrode 6b is formed to be folded back between both the principal surfaces of crystal blank 2 at the position of the end portion of crystal blank 2. Crystal blank 2 is fixed to and held in the recess of container body 1 and electrically and mechanically connected to container body 1 by fixing these lead electrodes 6b to crystal holding terminals 4 with, for example, conductive adhesive 7 or the like at the positions where a pair of lead electrodes 6b are led. Further, the mass of crystal blank 2 is supported by conductive adhesive 7. Here, as conductive adhesive 7, the conductive adhesive which is relatively rich in flexibility even after cured is used, in order to prevent a frequency variation from being caused as a result of stress being exerted on crystal blank 2 by residual stress at the time of curing of the adhesive. As a conductive adhesive having such a characteristic, for example, a silicone-based conductive adhesive is cited.

A metal thick film or metal ring 8 is provided on the top surface of container body 1 to surround an opening by the recess, and metal cover 3 is joined to metal ring 8 by seam welding or beam welding. Metal ring 8 is electrically connected to mounting electrodes 5b used as the ground terminals via through-holes formed in container body 1.

Such a surface-mount crystal unit is generally mounted on a wiring board by reflow soldering. In the crystal unit, laminated ceramics for which through-hole machining, formation of an interlayer conductive layer and the like are easily performed are used for the container body, and therefore, leading of the electrodes from the crystal blank can be easily performed.

Japanese Patent Laid-Open No. 9-326663 (JP-A-9-326663) discloses the crystal unit with the configuration in which covers are joined to a quartz crystal plate used as a vibration plate from above and below, and as a result, the vibration portion of the quartz crystal plate is hermetically encapsulated in a space formed by the upper and lower covers. In the crystal unit of JP-A-9-326663, as the upper and lower covers, the ones each constituted of quartz crystal are used, and these covers are joined to the quartz crystal plate used as the vibration plate by direct bonding. The direct bonding means that both members are joined in the form in which the atoms on the surface of one member and the atoms on the surface of the other member are chemically coupled. In the direct bonding of two members each constituted of quartz crystal, siloxane bond (Si—O—Si) is generally formed between both the members.

In the conventional crystal unit shown in FIGS. 1A and 1B, the crystal blank is fixed to the crystal holding terminals with, for example, the conductive adhesive or the like, but in such a configuration, when a mechanical impact is applied to the crystal unit, the impact which is applied to the crystal blank is directly transmitted to the conductive adhesive, and therefore, there is the fear that the conductive adhesive is torn off and peeled from the crystal holding terminals, or stress occurs to the conductive adhesive. When the conductive adhesive peels off, the crystal unit does not function as a crystal unit, and when stress occurs to the conductive adhesive, the characteristic of the system which mechanically holds the crystal blank varies, and therefore, the influence is exerted on the crystal blank and is likely to change the vibration characteristic and the resonance frequency of the crystal blank. Further, due to a variation in the inclination of the crystal blank in the container body, a free end of the crystal blank is likely to contact the container body or the metal cover, and in order to prevent such contact, the recess of the container body needs to be formed in a certain size or more.

On the other hand, in the configuration disclosed in JP-A-9-326663, the covers are joined to the quartz crystal plate which functions as the vibration plate by direct bonding, and therefore, occurrence of a trouble due to the conductive adhesive as described above when a mechanical impact is applied to the crystal unit is prevented, but since a special joining method called direct bonding is used, there are the problems that manufacture of the crystal unit is difficult and manufacture cost increases. Further, as the covers, only the covers made of quartz crystal or glass can be used, and therefore, there is the problem that the configuration for leading the electrodes, which are formed on the quartz crystal plate as the vibration plate, outside is complicated.

SUMMARY OF THE INVENTION

An object of the present invention is to provide a quartz crystal device which is easily made compact, does not cause a trouble when a mechanical impact is applied, and easily manufactured with electrodes from a crystal blank capable of being easily led.

According to one aspect of the present invention, a quartz crystal device includes: a crystal blank having an outer perimeter part and a vibration region partially separated mechanically from the outer perimeter part by a cut-out groove; a first container joined to a first principal surface of the crystal blank by being joined to an entire perimeter of the outer perimeter part of the crystal blank via a brazing material layer in the first principal surface; and a second container joined to a second principal surface of the crystal blank by being joined to an entire perimeter of the outer perimeter part of the crystal blank via a brazing material layer in the second principal surface, in where the vibration region of the crystal blank is hermetically encapsulated in a space formed by the first container, the second container and the outer perimeter part of said crystal blank.

According to such a configuration, the crystal blank is mechanically integrated with the first container and the second container by brazing using a brazing material layer, and therefore, an adhesive does not have to be used for mechanically holding the crystal blank. Accordingly, the problem of peeling of an adhesive does not occur when a mechanical impact is applied to the quartz crystal device, and therefore, the vibration characteristic is kept favorable. The problem of a variation of the inclination of the crystal blank does not occur, and therefore, the size, especially the height of the quartz crystal device can be suppressed to be small. By using brazing, manufacture of it is facilitated, a container constituted of, for example, laminated ceramics can be used as the container, and electrodes can be easily led from the crystal blank. As the brazing material layer, for example, the one constituted of a eutectic alloy can be used.

In the present invention, it is preferable that as the crystal blank, for example, the one having a substantially rectangular planar outer shape is used, and the cut-out groove is continuously formed to be along three sides of the outer perimeter of the crystal blank, so that the vibration region is mechanically connected to the outer perimeter part as an integral piece only in a connection region along the remaining one side of the outer perimeter of the crystal blank. In this case, the cut-out groove is formed into a shape in which three sides of a rectangle are connected, or in a U-shape in the plane of the crystal blank. In such a quartz crystal device, a pair of excitation electrodes are respectively provided on both principal surfaces of the vibration region of the crystal blank, lead electrodes are led to both side portions of the connection region from the excitation electrodes, and a pair of crystal connection terminals are provided in the second container to correspond to both side portions of the connection region so that the lead electrodes and the crystal connection terminals are electrically connected. For the electrical connection, for example, a conductive adhesive can be used. Further, it is preferable that the mounting electrodes are provided on the outer bottom surface of the second container, and that the crystal connection terminals and the mounting electrodes are electrically connected.

In the quartz crystal device according to the present invention, an IC chip on which a circuit using the crystal blank may be integrated may be hermetically encapsulated in the space formed by the first container, the second container and the outer perimeter part of the crystal blank. For example, the circuit which is integrated on the IC chip is the oscillating circuit using the crystal blank, and such a quartz crystal device is configured as a surface-mount crystal oscillator.

According to the present invention, for example, a quartz crystal device which is easily made compact, does not cause a trouble when mechanical impact is applied, and is easily manufactured, with electrodes capable of being easily led from a crystal blank, is obtained.

DETAILED DESCRIPTION OF THE PREFERRED EMBODIMENTS

Figure 1A:
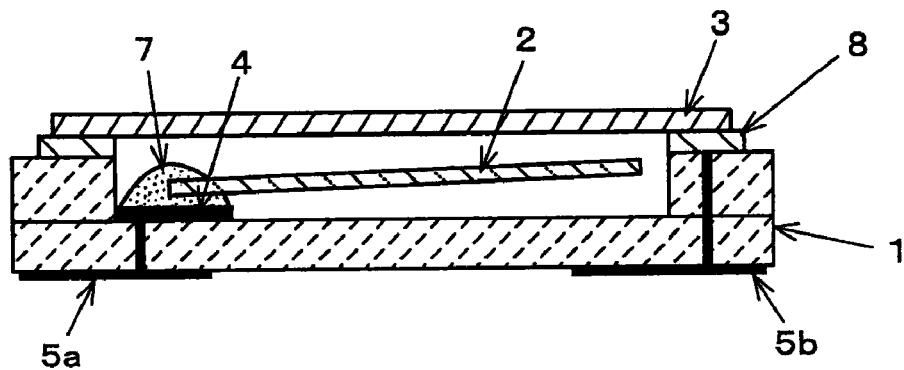
FIGS. 1A and 1B are respectively a sectional view and a bottom view showing a configuration of a conventional surface-mount crystal unit as one example of a quartz crystal device.
Figure 1B:
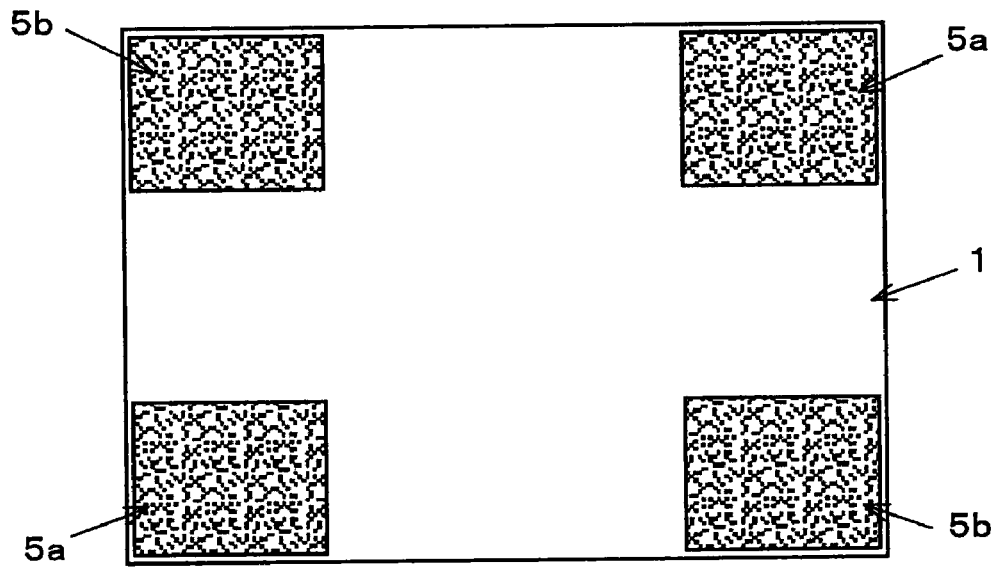
Figure 2:
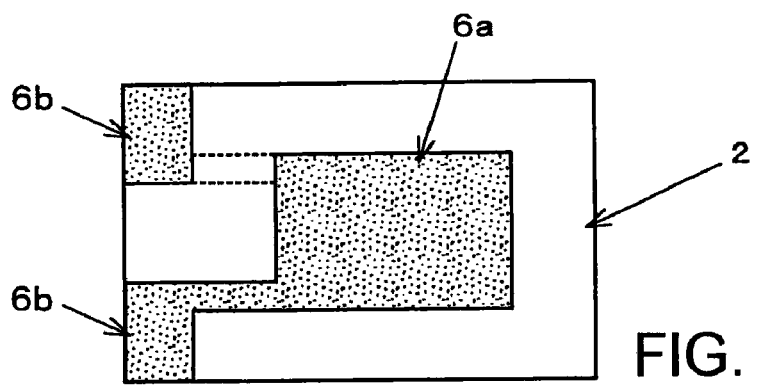
FIG. 2 is a plan view showing one example of a crystal blank for use in the conventional crystal unit.
Figure 3A:
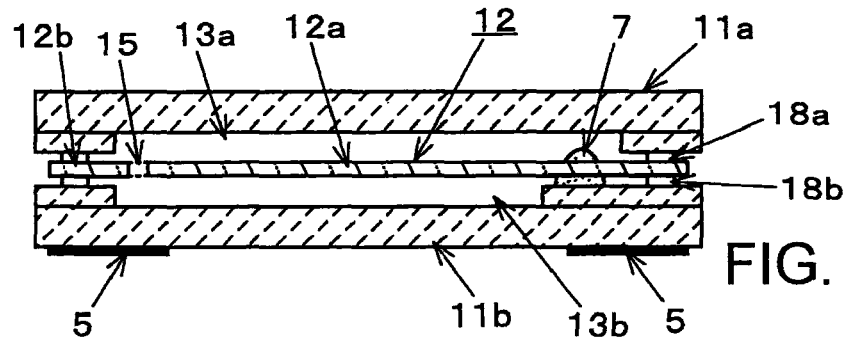
FIG. 3A is a sectional view showing a configuration of a crystal unit which is a quartz crystal device according to one embodiment of the present invention.
Figure 3B:
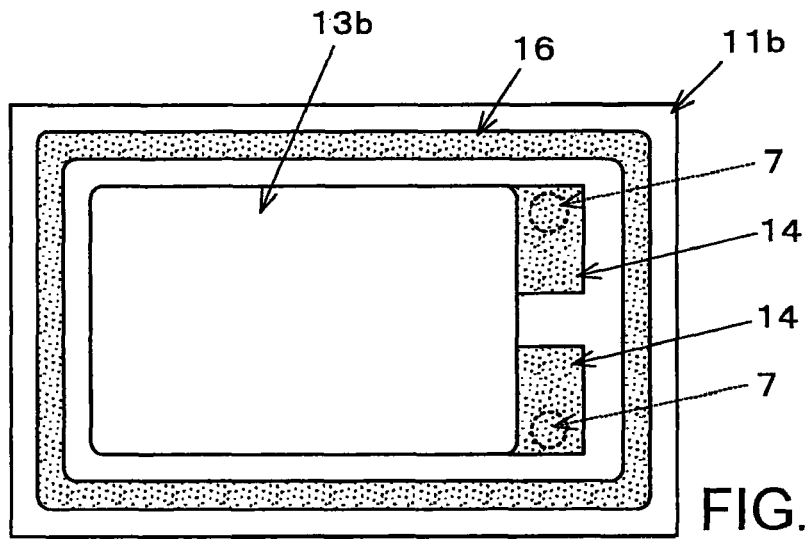
FIG. 3B is a top view showing a lower container in the crystal unit shown in FIG. 3A.

FIGS. 3A and 3B show a crystal unit which is a quartz crystal device according to one embodiment of the present invention. The crystal unit of the embodiment is configured by sandwiching quartz crystal blank 12 with upper container 11a and lower container 11b. Upper container 11a and lower container 11b have planar outer shapes substantially in rectangles in the same sizes. Each of container 11a and 11b is formed by laminated ceramics. Shallow recess 13a is formed on an undersurface illustrated in FIG. 3A of upper container 11a, and, likewise, shallow recess 13b is formed on a top surface illustrated in the drawing of lower container 11b. Recesses 13a and 13b are formed to be substantially rectangular regions so that outer perimeter parts of containers 11a and 11b are left in frame shapes and the portions other than the outer perimeter parts are recessed. A space defined by both recesses 13a and 13b becomes a space in which vibration region 12a of crystal blank 12 is held and hermetically encapsulated as will be described later. The depths of recesses 13a and 13b are at such a degree that vibration region 12a does not contact upper container 11a or lower container 11b. Mounting electrodes 5 which are used when the crystal unit is surface-mounted on a wiring board are provided respectively at four corner portions of an outer bottom surface of lower container 11b.

Figure 4:
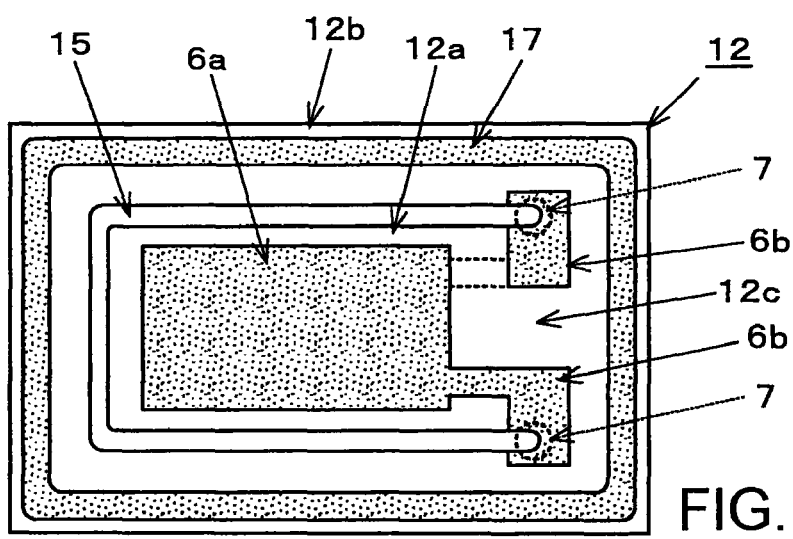
FIG. 4 is a plan view showing a configuration of a crystal blank used in the crystal unit shown in FIGS. 3A and 3B.

Crystal blank 12 is configured by a substantially rectangular quartz crystal plate having a planar outer shape which is a slightly smaller than those of containers 11a and 11b as shown in FIGS. 3A and 4. Crystal blank 12 is, for example, an AT-cut quartz crystal blank. Crystal blank 12 is provided with cut-out groove 15 which penetrates through one principal surface and the other principal surface of crystal blank 12 to be along three sides of a substantially rectangular crystal blank 12, and by cut-out groove 15, vibration region 12a in a central portion is separated from outer perimeter part 12b of crystal blank 12. Specifically, cut-out groove 15 is provided in a U-shape or a shape in which the three sides of a rectangle are connected in crystal blank 12. Cut-out groove 15 is not formed along one side out of the four sides of crystal blank 12, and therefore, if the region is set as connection region 12c, vibration region 12a is mechanically connected to outer perimeter part 12b in connection region 12c as an integral piece. At this time, vibration region 12a is held by outer perimeter part 12b with the side at connection region 12c as a fixed end, and the opposite side to it as a free end.

In vibration region 12a of crystal blank 12, excitation electrodes 6a are formed respectively on both principal surfaces. A pair of lead electrodes 6b are extended from a pair of excitation electrodes 6a to both sides of an end portion at the side of connection region 12c, of vibration region 12a. Lead electrodes 6b are provided to contact both tip end portions of cut-out groove 15 and have the tip end portions of cut-out groove 15 engaged in them. Lead electrodes 6b are formed on both principal surfaces of crystal blank 12 at positions of both the tip end portions of cut-out groove 15, and lead electrodes 6b respectively formed on both the principal surfaces are electrically connected to each other with conductive adhesive 7 coated on an inside of cut-out groove 15 at the positions where the tip end portions of cut-out groove 15 engage in lead electrodes 6b as will be described later. Further, on both the principal surfaces of crystal blank 12, electrode layers 17 are each formed into a frame shape, that is, a shape in which four sides of a rectangle are connected, along an outer perimeter of crystal blank 12. Electrode layers 17 are provided to be separated from excitation electrodes 6a and lead electrodes 6b. Each electrode layer 17 is formed on the outermost perimeter of crystal blank 12, and therefore, the aforesaid cut-out groove 15 is formed in an inner side from electrode layer 17, in crystal blank 12.

Recess 13b of lower container 11b is formed in a position where vibration region 12a of crystal blank 12 and cut-out groove 15 are present when crystal blank 12 described above is overlaid on a top surface of lower container 11b. Accordingly, in lower container 11b, a frame width of a frame part surrounding recess 13b is large at connection region 12c side of crystal blank 12, and becomes small at a side opposite to connection region 12c. On a top surface of the frame part of lower container 11b, electrode layer 16 corresponding to electrode layer 17 on crystal blank 12 is formed in a frame shape, that is, a shape in which four sides of a rectangle are connected. On the top surface of the frame part of lower container 11b, which corresponds to the side at connection regions 12c, of crystal blank 12, a pair of crystal connection terminals 14 are formed to correspond to the tip end portions of lead electrodes 6b formed on crystal blank 12. Crystal connection terminals 14 are provided to be separated from electrode layer 16. Crystal connection terminals 14 are electrically connected to mounting electrodes 5 which are formed on the outer bottom surface of lower container 11b via through-holes (or via-holes) and conductive paths formed in lower container 11b.

In upper container 11a, electrode layer 16 is formed to be along an outer perimeter of upper container 11a on an opening end surface of recess 13a, that is, the surface of the frame part surrounding recess 13a. Electrode layer 16 of upper container 11a also corresponds to electrode layer 17 of crystal blank 12, and is formed into a frame shape, that is, a shape in which four sides of a rectangle are connected.

Electrode layers 16 and 17 are formed as, for example, gold (Au) plated layers patterned in the aforementioned shapes.

In the crystal unit, electrode layer 16 of lower container 11b and electrode layer 17 on the undersurface illustrated in the drawing of crystal blank 12 are joined by brazing by brazing material layer 18b, and a pair of crystal connection terminals 14 and a pair of lead electrodes 6b are electrically connected by coating conductive adhesive 7 on both the tip end portions of cut-out groove 15 of crystal blank 12. Further, electrode layer 16 of upper container 11a and electrode layer 17 on the top surface illustrated in the drawing of crystal blank 12 are joined by brazing by brazing material layer 18a. As brazing material layers 18a and 18b, for example, a eutectic alloy may be used. A gold-tin (Au—Sn) eutectic alloy and the like may be used as a concrete example of the brazing material layers. Electrode layers 16 and 17 function as primer layers for brazing material layers 18a and 18b when brazing is performed.

By brazing the entire perimeters of electrode layers 16 and 17 which are formed into frame shapes, upper container 11a, crystal blank 12 and lower container 11b are integrated, a space formed by recesses 13a and 13b of containers 11a and 11b becomes a hermetically sealed space which is hermetically shut off from the outside, and vibration region 12a of crystal blank 12 is held in the space. Further, exciting electrodes 6a formed on vibration region 12a of crystal blank 12 are electrically connected to mounting electrodes 5 formed on the outer bottom surface of lower container 11b through lead electrodes 6b, conductive adhesive 7, crystal connection terminals 14 and conductive paths formed in lower container 11b. In the crystal unit, vibration region 12a of crystal blank 12 is mechanically held by both containers 11a and 11b via connection region 12c and outer perimeter part 12b. Therefore, conductive adhesive 7 for electrically connecting lead electrodes 6b and crystal connection terminals 14 do not take in part in mechanically holding crystal blank 12. Accordingly, even if a mechanical impact is applied to crystal unit, peeling of conductive adhesive 7 does not occur, and the characteristic of the system which mechanically holds vibration region 12a of crystal blank 12 does not change.

Such a crystal unit is completed, for example, by preparing brazing material layers 18a and 18b each formed into a frame shape after separately preparing upper container 11a, lower container 11b and crystal blank 12, placing crystal blank 12 on lower container 11b via brazing material layer 18b, coating a conductive adhesive on both tip end portions of cut-out groove 15 of crystal blank 12 to connect lead electrodes 6b and crystal connection terminals 14 electrically, thereafter, placing upper container 11a on crystal blank 12 via brazing material layer 18a, heating them and performing brazing. Crystal connection terminals 14 and electrode layer 16 of lower container 11a are separately provided, and lead electrodes 6b and electrode layer 17 are separately provided in crystal blank 12, and thereby, brazing material (eutectic alloy) is prevented from flowing out to the direction of vibration region 12a at the time of brazing.

In the crystal unit of this embodiment, conductive adhesive 7 does not take part in mechanical holding of crystal blank 12 as described above, and therefore, a trouble due to the conductive adhesive does not occur when a mechanical impact is applied. Further, the crystal unit can be manufactured by using a simple process of brazing instead of direct bonding, and the containers constituted of laminated ceramics can be used. Therefore, the electrodes can be easily led from the crystal blank. In the above description, upper container 11a and lower container 11b are constituted of laminated ceramics, but the upper container and lower container which are constituted of other materials can be used as long as they have airtightness and withstand the temperature of brazing. For example, an upper container and a lower container constituted of glass or quartz can be used.

Figure 5:
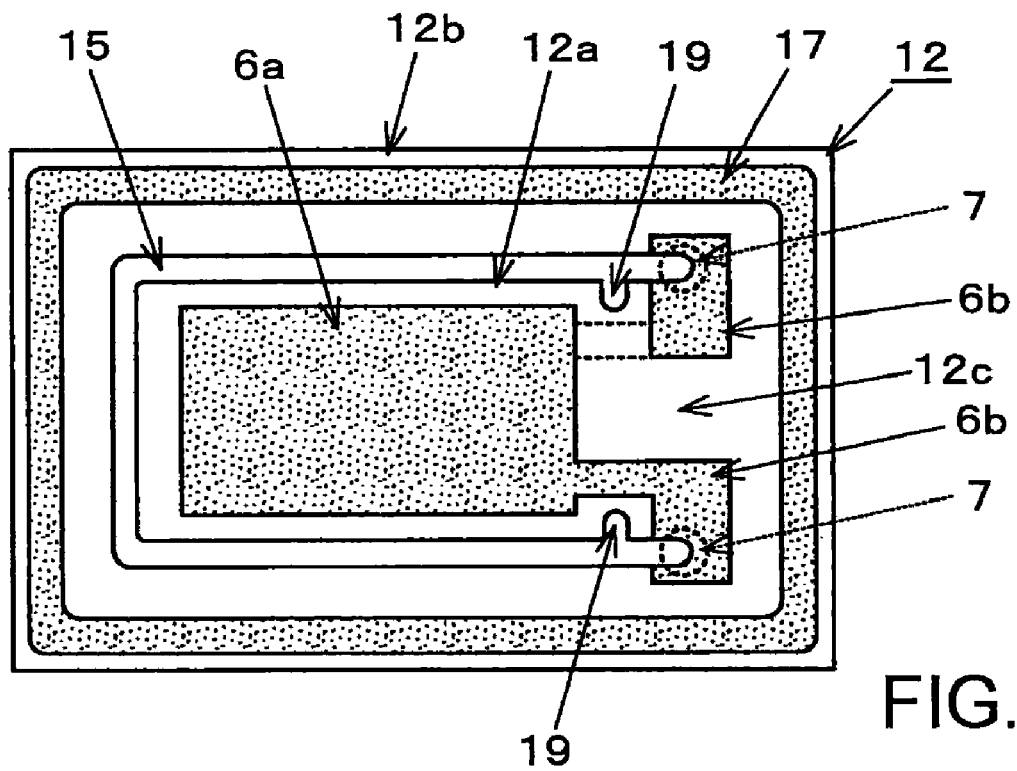
FIG. 5 is a plan view showing another example of the configuration of the crystal blank.

When upper container 11a and lower container 11b are configured by laminated ceramics, and crystal blank 12 and respective containers 11a and 11b are joined by brazing, due to the difference in thermal expansion coefficient among them, stress is applied to crystal blank 12 upon the change of temperature changes, and this is likely to lead to degradation of the vibration characteristic of crystal blank 12. In the crystal unit of the present embodiment, degradation or the like of the vibration characteristic does not occur unless stress is applied to vibration region 12a of crystal blank 12. Therefore, as shown in FIG. 5, constriction parts 19 may be provided in connection region 12c in such a manner as cut-out groove 15 is branched to engage in connection region 12c in the tip end portions of cut-out groove 15. By providing constriction parts 19 like this, and reducing the width of the portion where vibration region 12a and outer perimeter part 12b are connected, stress applied to outer perimeter part 12b of crystal blank 12 is hardly transmitted to vibration region 12a, and the vibration characteristic is kept more favorable even if the temperature changes.

The quartz crystal device of the present invention is not limited to the aforementioned crystal unit. A crystal oscillator in which a crystal blank and an IC (integrated circuit) chip including an oscillating circuit using the crystal blank are integrated is also included within the category of the quartz crystal device of the present invention. The IC chip is housed in the same hermetically sealed space as the vibration region of the crystal blank, for example.

Figure 6A:
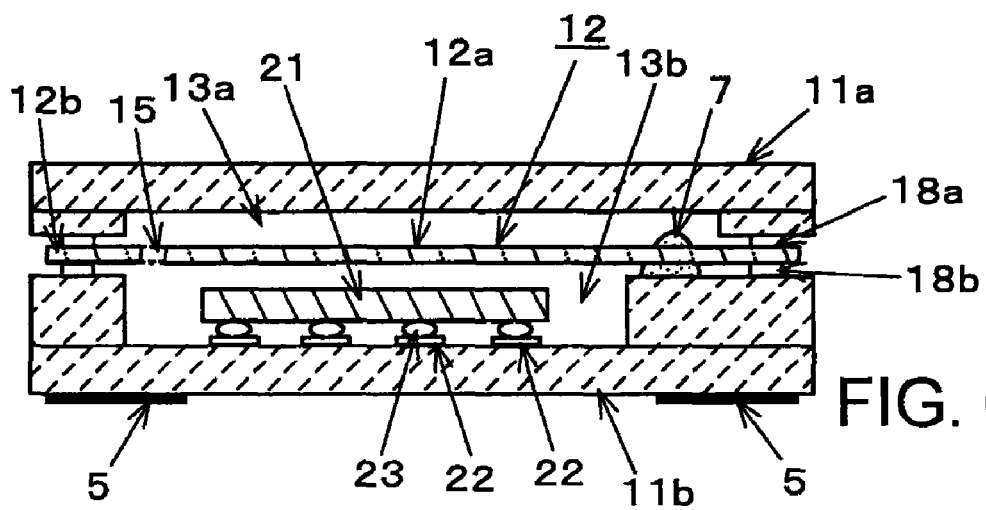
FIGS. 6A to 6C are all sectional views showing configuration examples of the quartz crystal device configured as a crystal oscillator.

FIG. 6A shows one example of a configuration of such a crystal oscillator. The illustrated crystal oscillator is such that the depth of recess 13b of lower container 11b is made large in the crystal unit shown in FIGS. 3A and 3B, and IC chip 21 is fixed to a bottom portion of recess 13b. Crystal blank 12 is separated from IC chip 21 and located above IC chip 21. IC chip 21 has a substantially rectangular shape, and has electronic circuits including at least an oscillating circuit using crystal blank 12 integrated thereon. The electronic circuits may include a temperature compensating mechanism for compensating the frequency temperature characteristics of crystal blank 12. In IC chip 21, the electronic circuits such as an oscillating circuit is formed on one principal surface of a semiconductor substrate by an ordinary semiconductor device fabricating process, and therefore, the one principal surface on which these electronic circuits are formed out of a pair of principal surfaces of the semiconductor substrate will be called a circuit formation surface of the IC chip. On the circuit formation surface, a plurality of IC terminals for connecting IC chip 21 to an external circuit are also formed.

A plurality of circuit terminals 22 which are electrically connected to crystal connection terminals 14 and mounting electrodes 5 are also provided on a surface of lower container 11b, that is, a inner bottom surface of recess 13b. IC chip 21 is fixed to the bottom surface of recess 13b by electrically and mechanically connecting the IC terminals to circuit terminals 22 by ultrasonic thermo-compression bonding using bumps 23 in such a manner as the circuit formation surface faces the bottom surface of recess 13b of lower container 11b. Thereby, the electronic circuits in IC chip 21 are electrically connected to crystal blank 12, and are also connected to mounting electrodes 5 to function as a crystal oscillator.

Figure 6B:
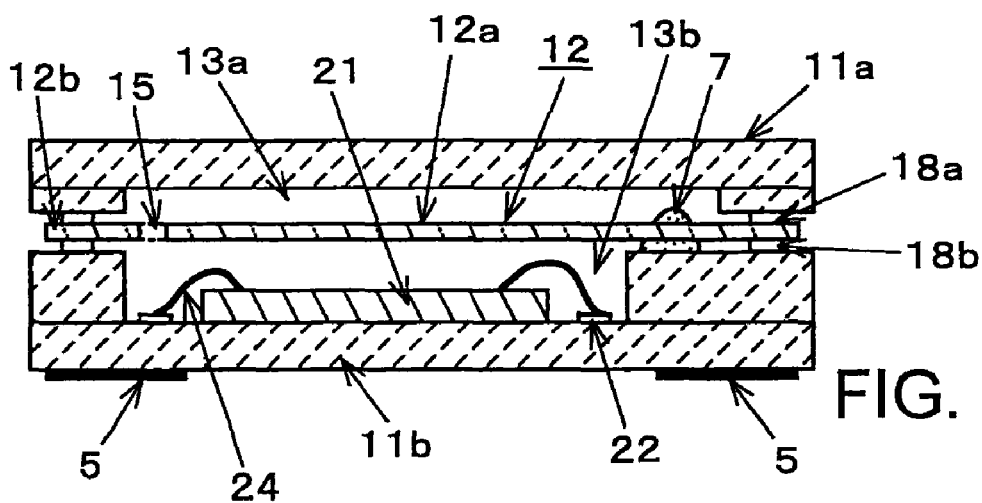

The crystal oscillator shown in FIG. 6B is similar to the one shown in FIG. 6A, but differs from the one in FIG. 6A in the point that electrical connection to IC chip 21 is established by wire bonding. IC chip 21 is fixed to the bottom surface of recess 13b by, for example, an adhesive or the like, so that the surface which is not a circuit formation surface faces the bottom surface of recess 13b. By connecting circuit terminals 22 and the IC terminals by bonding wires 24, the electronic circuits in IC chip 21 are electrically connected to crystal blank 12 and mounting electrodes 5. In the crystal oscillator, crystal blank 12 is also separated from IC chip 21 and bonding wire 24 and located above IC chip 21.

Figure 6C:
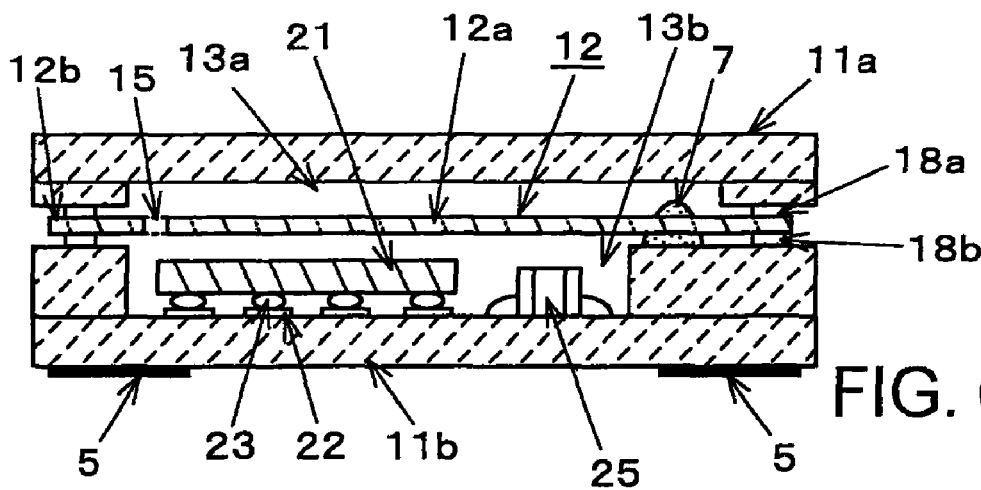

The crystal oscillator shown in FIG. 6C is such that in the one shown in FIG. 6A, chip component 25 or a chip part such as a chip capacitor is mounted on the bottom surface of recess 13b together with IC chip 21. A capacitor required by an oscillating circuit or the like sometimes cannot be integrated in IC chip 21 depending on the capacitance value, and therefore, in such a case, the capacitor is housed in recess 13b separately form IC chip 21 as a chip capacitor. In this case, crystal blank 12 is also separated from IC chip 21 and chip component 25, and located above IC chip 21 and chip component 25.

In the crystal oscillator shown in each of FIGS. 6A to 6C, IC chip 21 and chip component 25 may be mounted in recess 13b of upper container 11a.

What is claimed is:

1. A quartz crystal device comprising:
    a crystal blank having an outer perimeter part and a vibration region partially separated mechanically from the outer perimeter part by a cut-out groove;
    a first container joined to a first principal surface of said crystal blank by being joined to an entire perimeter of the outer perimeter part of aid crystal blank via a brazing material layer in the first principal surface; and
    a second container joined to a second principal surface of said crystal blank by being joined to an entire perimeter of the outer perimeter part of said crystal blank via a brazing material layer in the second principal surface;
    wherein the vibration region of said crystal blank is hermetically encapsulated in a space formed by said first container, said second container and the outer perimeter part of said crystal blank;
    wherein said crystal blank has a substantially rectangular planar outer shape, and by forming said cut-out groove continuously along three sides of an outer perimeter of said crystal blank, said vibration region mechanically connects to said outer perimeter part as an integral piece only in a connection region along one side of said outer perimeter,
    wherein said crystal blank comprises:
        a pair of excitation electrodes respectively provided on both principal surfaces of said vibration region; and
        lead electrodes led to both side portions of said connection region from said excitation electrodes;
        wherein a pair of crystal connection terminals are provided at said second container to correspond to both side portions of said connection region, and said lead electrode sand said crystal connection terminals are electrically connected; and
    wherein an IC chip on which a circuit electrically connected to said crystal connection terminals and using said crystal blank is integrated is hermetically encapsulated in said space together with said vibration region.

2. The quartz crystal device according to claim 1, wherein said lead electrodes and said crystal connection terminals are electrically connected by a conductive adhesive.

3. The quartz crystal device according to claim 1, wherein mounting electrodes are provided on an outer bottom surface of said second container, and said crystal connection terminals and said mounting electrodes are electrically connected.

4. The quartz crystal device according to claim 1, wherein said circuit is an oscillating circuit using said crystal blank, and said quartz crystal device is configured as a surface-mount crystal oscillator.

5. The quartz crystal device according to claim 1, wherein said brazing material layer is constituted of a eutectic alloy.

6. The quartz crystal device according to claim 1, wherein each of said first container and said second container is constituted of laminated ceramics.

* * * * *